United States Patent [19]
Chen et al.

[11] Patent Number: 6,167,561
[45] Date of Patent: *Dec. 26, 2000

[54] METHOD AND APPARATUS FOR ENTRY OF TIMING CONSTRAINTS

[75] Inventors: Benjamin Chen, Belmont; Peter Macliesh, Sunnyvale; Albert Wang, Fremont, all of Calif.

[73] Assignee: Synopsis, Inc., Mountain View, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/093,714

[22] Filed: Jun. 8, 1998

[51] Int. Cl.$^7$ .................................................. G06F 17/50
[52] U.S. Cl. .................... 716/18; 716/8; 716/10; 716/6; 717/10; 703/23
[58] Field of Search ............... 395/704, 500.44, 395/710; 379/27; 364/489; 703/23; 717/10; 716/18, 8

[56] References Cited

U.S. PATENT DOCUMENTS

| | | | |
|---|---|---|---|
| 5,513,356 | 4/1996 | Takahashi et al. | 717/10 |
| 5,604,888 | 2/1997 | Kiani-Shabestari et al. | 703/23 |
| 5,673,198 | 9/1997 | Lawman et al. | 364/489 |
| 5,801,958 | 9/1998 | Dangelo et al. | 716/18 |
| 5,870,308 | 2/1999 | Dangelo et al. | 716/18 |
| 5,881,131 | 3/1999 | Farris et al. | 379/27 |
| 5,910,899 | 6/1999 | Barrientos | 716/8 |
| 5,937,190 | 8/1999 | Gregory et al. | 395/704 |
| 6,058,252 | 5/2000 | Noll et al. | 703/23 |

OTHER PUBLICATIONS

Article by Steven E. Schulz entitled "Timing Verification Algorithms for Digital Designs," Design Automation, Mar. 1991, pp. 20–27.
Manual Pages, Group–Path Command Design Compiler, Version 1998.02, Publication Date: Unknown.
Manual Pages, Report–Timing Command Design Compiler, Version 1998.02, Publication Date: Unknown.

*Primary Examiner*—Paul R. Lintz
*Assistant Examiner*—Jibreel Speight
*Attorney, Agent, or Firm*—Squire, Sanders & Dempsey L.L.P.

[57] ABSTRACT

A method and apparatus providing a graphical user interface (GUI) that automatically determines timing groups and path groups for a circuit representation. In a first GUI display level, the GUI displays each path group in the circuit and allows the user to change the timing constraints for each path group. In addition, the GUI indicates whether each timing group is activated by a rising or falling clock signal. In addition, the user can define subpaths of a path group. After timing analysis software has analyzed the circuit, by clicking on a timing group in the first GUI display level, the user can view a second GUI display level, which shows details of the paths in the indicated timing group. By clicking on a path in the second GUI display level, the user can view a third GUI display level, which shows a list of each of the elements in the indicated path.

13 Claims, 19 Drawing Sheets

PRIOR TO DISPLAYING GUI

DETERMINING A TIMING GROUP

EXAMPLE CIRCUIT

EXAMPLE CIRCUIT

FIG. 7A
TIMING GROUPS AND CLOCK NETS
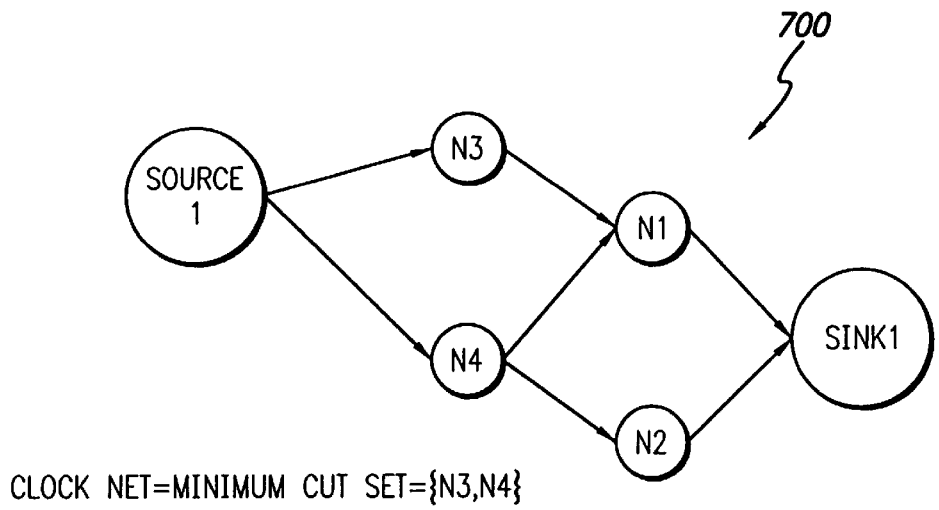
CLOCK NET=MINIMUM CUT SET={N3,N4}
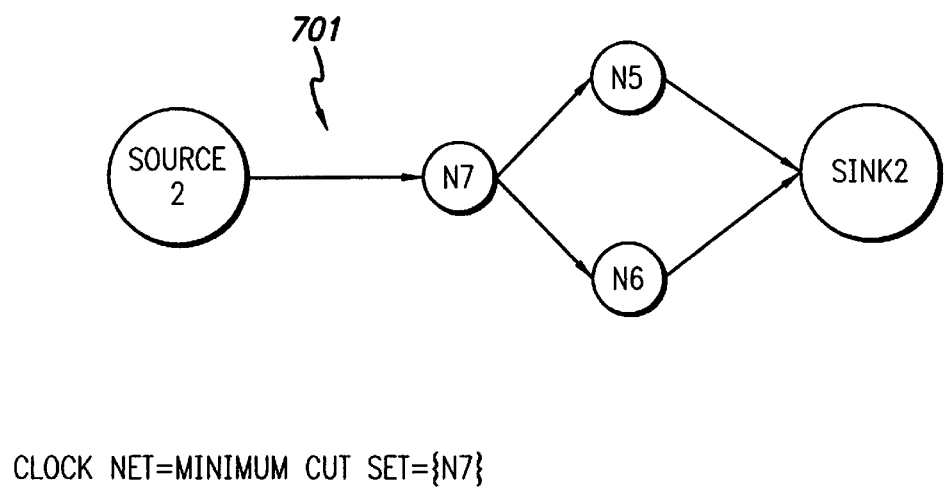
CLOCK NET=MINIMUM CUT SET={N7}
FIG. 7B
TIMING GROUPS AND CLOCK NETS

DETERMINING PATH GROUPS

TIMING GROUPS OF A CIRCUIT STORED IN MEMORY

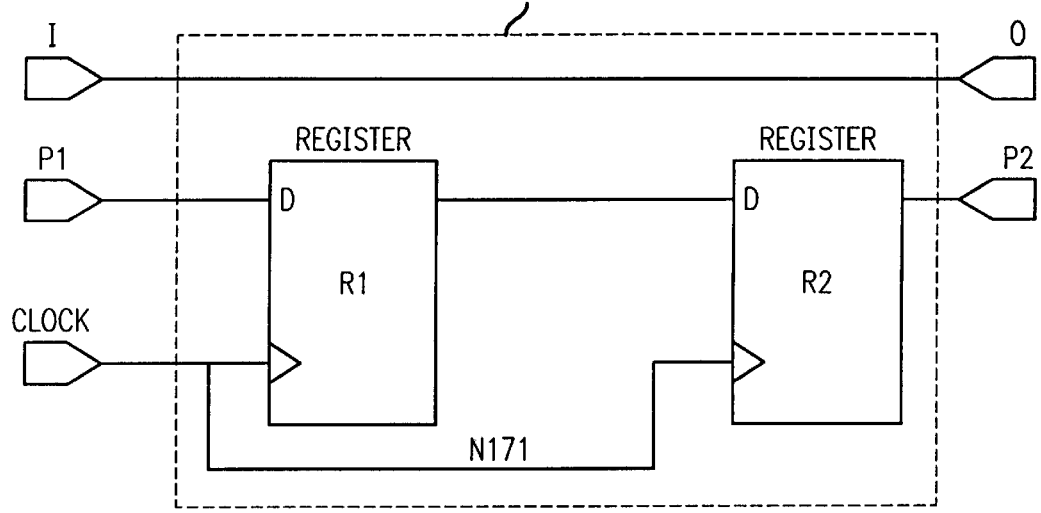
FIG. 8B  TIMING GROUP NAMED RC-N171
TIMING GROUPS=ALL INPUTS; ALL OUTPUTS; RC-N171
   PATH GROUPS=1) ALL INPUTS TO ALL OUTPUTS
              2) ALL INPUTS TO RC-N171
              3) RC-N171 TO ALL OUTPUTS
              4) RC-N171 TO RC-N171
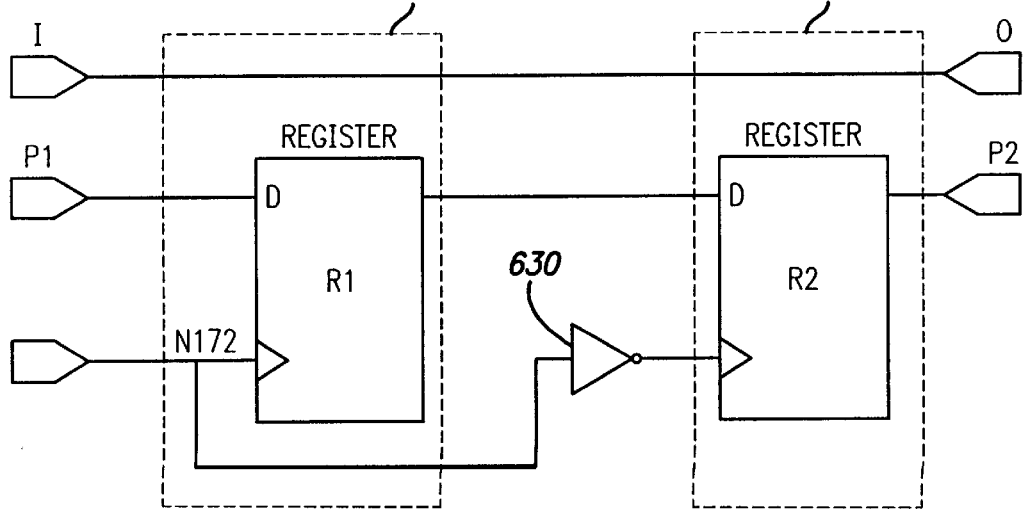
FIG. 8C  TIMING GROUP NAMED RC-N172    TIMING GROUP NAMED FC-N172
TIMING GROUPS=ALL INPUTS; ALL OUTPUTS; FC-N172, FC-N173
   PATH GROUPS=1) ALL INPUTS TO ALL OUTPUTS
              2) ALL INPUTS TO FC-N172
              3) FC-N172 TO ALL OUTPUTS
              4) RC-N172 TO FC-N172

860 ⟶

| FROM | TO |
|---|---|
| ALL INPUT PORTS | ALL OUTPUT PORTS |
| ALL INPUTS PORTS | RC-N171 |
| RC-N171 | ALL OUTPUT PORTS |
| RC-N171 | RC-N171 |

FIG. 8E
PATH GROUPS OF A CIRCUIT STORED IN MEMORY

870 ⟶

| | |
|---|---|
| ALL INPUT PORTS TO ALL OUTPUT PORTS | 60 |
| ALL INPUT PORTS TO RC-N171 | 30 |
| RC-N171 TO ALL OUTPUT PORTS | 30 |
| RC-N171 TO RC-N171 | 30 |

872

FIG. 8F
REQUIRED DELAY VALUES FOR PATH GROUPS OF A CIRCUIT IN MEMORY

880 ⟶

| | |
|---|---|
| ALL INPUT PORTS TO ALL OUTPUT PORTS | 28 |
| ALL INPUT PORTS TO RC-N171 | 15 |
| RC-N171 TO ALL OUTPUT PORTS | 25 |
| RC-N171 TO RC-N171 | 16 |

872

FIG. 8G
ESTIMATED DELAY VALUES FOR PATH GROUPS OF A CIRCUIT IN MEMORY

| FROM | TO | DELAY |
|---|---|---|
| addr_select | dr_addr<9> | 28.3 |
| addr_select | dr_addr<9> | 28.3 |
| addr_select | dr_addr<9> | 28.3 |
| addr_select | dr_addr<9> | 28.3 |
| addr_select | dr_addr<9> | 28.3 |
| addr_select | dr_addr<9> | 28.3 |
| addr_select | dr_addr<9> | 28.3 |
| addr_select | dr_addr<9> | 28.3 |
| addr_select | dr_addr<9> | 28.3 |
| addr_select | dr_addr<9> | 28.3 |

880

FIG. 8H
DELAYS OF PINS OF A SINGLE PATH GROUP OF A CIRCUIT STORED IN MEMORY

| INSTANCE PATH | CELL TYPE | DELAY | FANOUT |
|---|---|---|---|
| addr_select/ addr_select | IN | 0.0 | 1 |
| C154/1 | IBUF | 0.0 | 1 |
| C154/0 | IBUF | 3.0 | 14 |
| C246/10 | EQN | 3.0 | 14 |
| C246/0 | EQN | 7.1 | 9 |
| C224/12 | EQN | 7.1 | 9 |
| C224/0 | EQN | 11.2 | 1 |
| C222/11 | EQN | 11.2 | 1 |
| C222/0 | EQN | 15.3 | 1 |
| C240/1 | OBUF | 15.3 | 1 |
| C204/0 | OBUF | 28.3 | 0 |
| dr_addr<3>/ dr_addr<3> | OUT | 28.3 | 0 |

890

FIG. 8I
DELAYS OF INSTANCE PATHS OF A PINS OF A SINGLE PATH GROUP OF A CIRCUIT STORED IN MEMORY

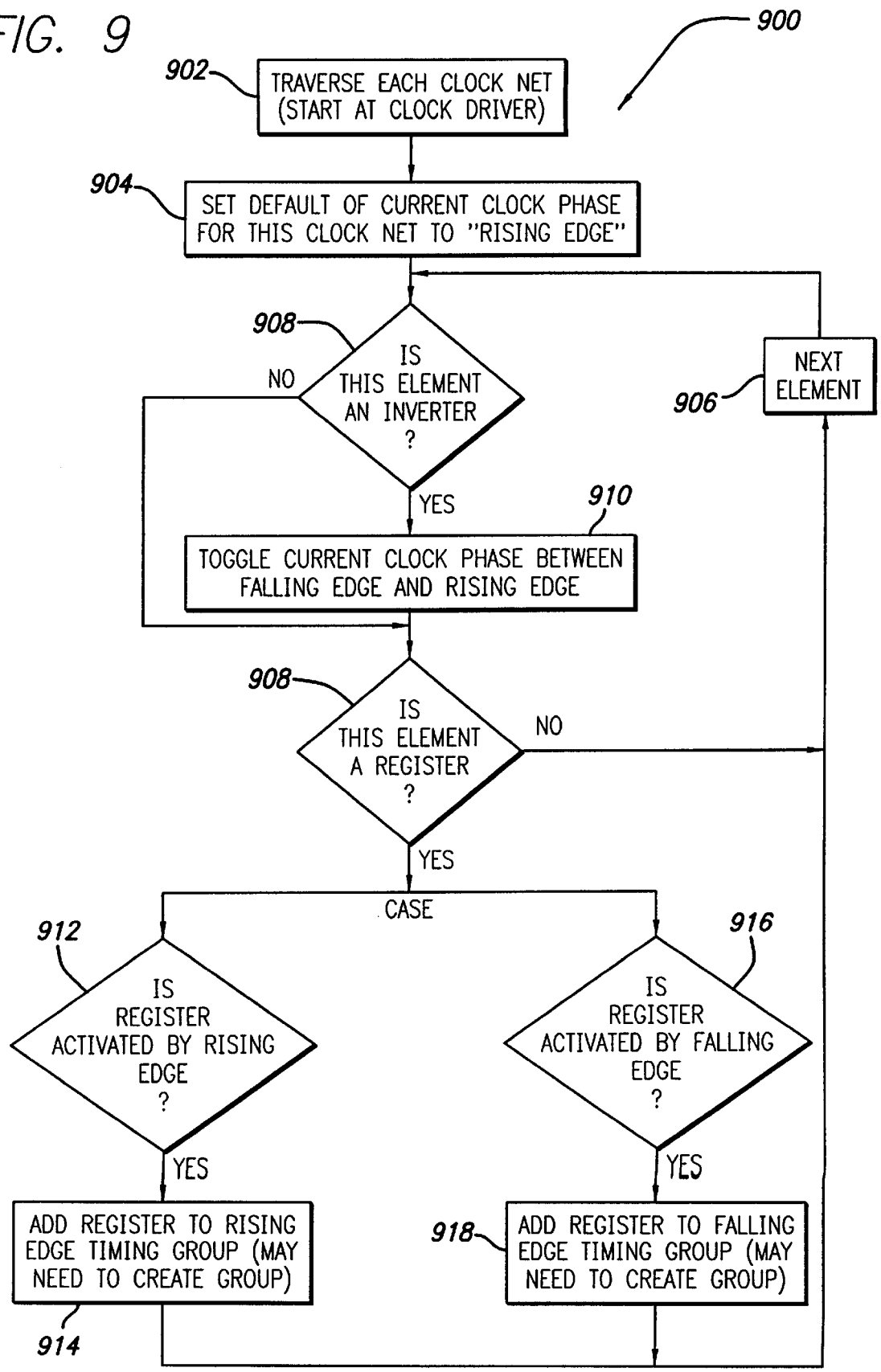

ADDING A SUBPATH

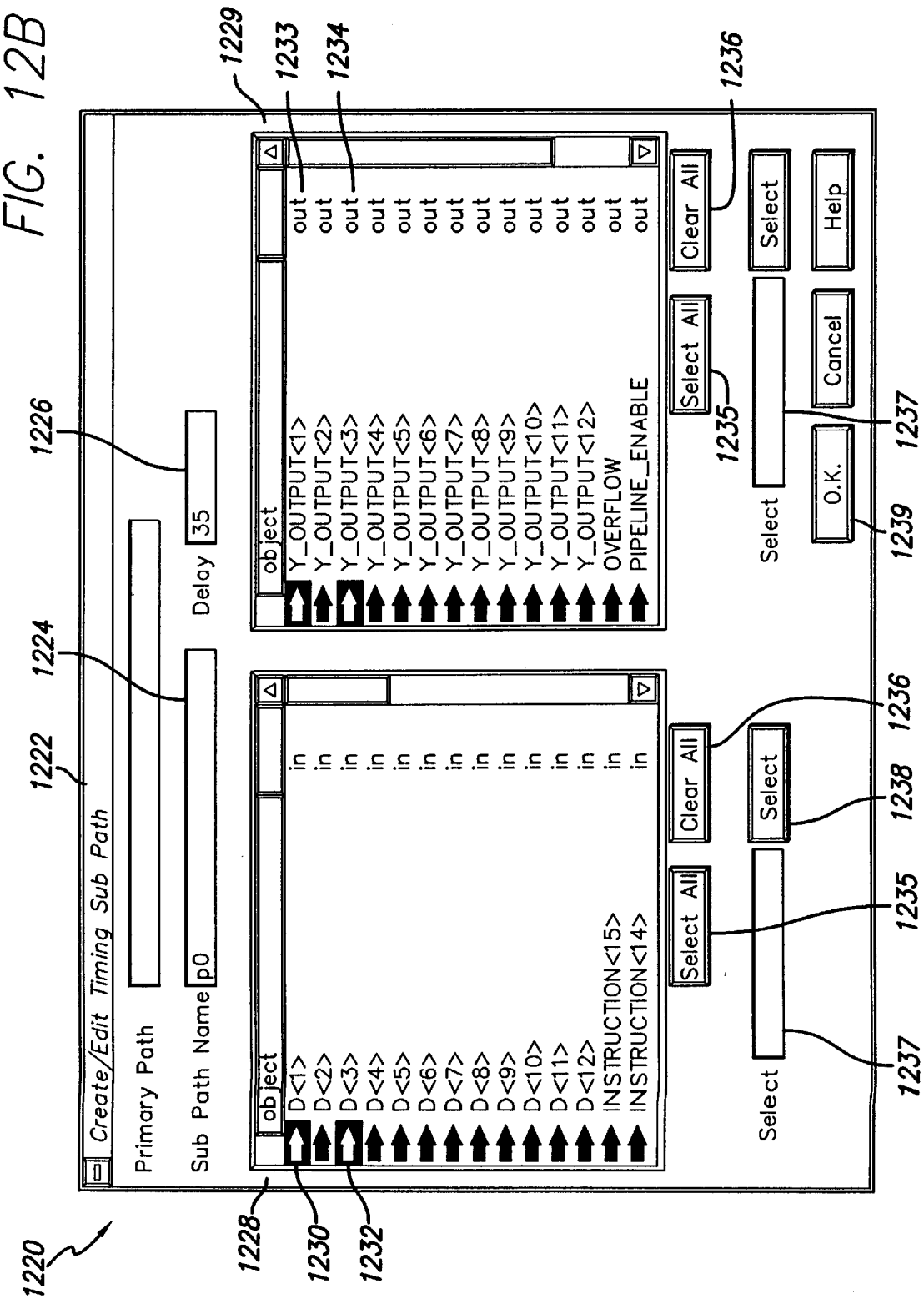

6,167,561

METHOD AND APPARATUS FOR ENTRY OF TIMING CONSTRAINTS

BACKGROUND OF THE INVENTION

The present invention relates generally to circuit synthesis and, specifically, to a method and apparatus for allowing a user to easily enter, change, and evaluate timing constraints for a circuit design.

Debugging the timing of a circuit design is an extremely complex design task. Various conventional software products assist a human designer in performing circuit design and analysis. For example, Design Compiler™ sold by Synopsys, Inc. of Mountain View, Calif. includes a timing verifier that assists in the design process. The primary user-entered command used to generate timing information in Design Compiler™ is "report_timing." The portion of the manual page for the report_timing command in Design Compiler version 1998.02, available from Synopsys, Inc. of Mountain View, Calif. is hereby incorporated by reference. When the Design Compiler software executes, it accepts a command from a user, such as "report_timing." After the user enters this command, the software generates a tabular report that indicates the delay through the longest path in each clock domain. This report is static and cannot be altered by the user.

If the user wants to modify the behavior of report_timing, the user must enter yet another command: the "group_path" command. The portion of the manual page for the group_path command in Design Compiler version 1998.02, available from Synopsys, Inc. of Mountain View, Calif. is hereby incorporated by reference. The "group_path" command allows the user to specify a custom group of signal paths so that report_timing shows the worst path in each custom path group. Although this approach is very general, it requires the user to carefully determine valid path start and end points for each path. Path start points are input ports to the circuit, and clock pins on registers. Path end points are output ports of the circuit, and data pins on registers. The user must either use commands to specifically identify all of the ports and/or registers, or must know the names of specific ports and/or registers. Alternatively, the user must specify the start and end points of a path when using the report_timing command. To see the delay for multiple paths simultaneously the user must specify how many paths to report.

Another approach to debugging timing is described in co-pending U.S. application Ser. No. 08/266,147, entitled "Architecture and Methods for a Hardware Description Language Source Level Analysis and Debugging System" of Craven et al., which is hereby incorporated by reference. This application describes Path Browser software. The Path Browser software requires the user to identify the appropriate endpoint for the path. Then a single path is displayed, but individual cell delay numbers are not shown with the cells.

SUMMARY OF THE INVENTION

A described embodiment of the present invention provides a graphical user interface (GUI). Prior to displaying the first GUI display level, the GUI software automatically determines timing groups and path groups for a circuit representation. In a first GUI display level, the GUI displays each path group in the circuit and allows the user to change the timing constraints for each path group. In addition, the GUI indicates whether each timing group is activated by a rising or falling clock signal. In addition, the user can define subpaths of a path group. After timing analysis software has analyzed the circuit, by clicking on a timing group in the first GUI display level, the user can view a second GUI display level, which shows details of the paths in the indicated timing group. By clicking on a path in the second GUI display level, the user can view a third GUI display level, which shows a list of each of the elements in the indicated path.

In accordance with the purpose of the invention, as embodied and broadly described herein, the invention relates to a method of allowing a user to specify timing constraints, comprising the steps, performed by a data processing system, of: determining the timing groups for a circuit representation; determining the path groups for a circuit representation in accordance with the determined timing groups; displaying a first GUI display level in accordance with the determined path groups, wherein a timing constraint value is shown for each path group; detecting that a user has selected and changed one of the timing constraint values in the first GUI display level; and changing a corresponding timing constraint value stored in memory.

Advantages of the invention will be set forth in part in the description which follows and in part will be obvious from the description or may be learned by practice of the invention. The objects and advantages of the invention will be realized and attained by means of the elements and combinations particularly pointed out in the appended claims and equivalents.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIGS. 7(a) and 7(b) show graphs used to determine respective clock nets and timing groups for the circuit representations of FIGS. 6(a) and 6(b).

FIG. 8(b) is an example of timing groups and timing groups for an exemplary circuit where all registers are clocked by the same phase clock signal.

FIG. 8(c) is an example of path groups and timing groups for another exemplary circuit where not all the registers are clocked by the same phase clock signals.

FIG. 8(e) is an example of a path group table stored in a memory for the circuit of FIG. 8(b).

FIG. 8(f) is an example of required delay timing constraints stored in a memory for the circuit of FIG. 3(a).

FIG. 8(g) is an example of estimated delay timing constraints stored in a memory for the circuit of FIG. 3(b).

FIG. 8(h) is an example of delays for pin nets of a single path group of a circuit stored in memory.

FIG. 8(i) is an example of delays stored in memory for instance paths between pins of a single path group of a circuit.

FIG. 9 is a flow chart showing steps to break a timing group into rising edge and falling edge activated timing groups.

FIGS. 12(a)–12(c) show an example of display screens used to add subpaths in accordance with the present invention.

DETAILED DESCRIPTION OF PREFERRED EMBODIMENTS

Reference will now be made in detail to several embodiments of the present invention, examples of which are illustrated in the accompanying drawings. Wherever practicable, the same reference numbers will be used throughout the drawings to refer to the same or like parts.

I. General Discussion

Figure 1:
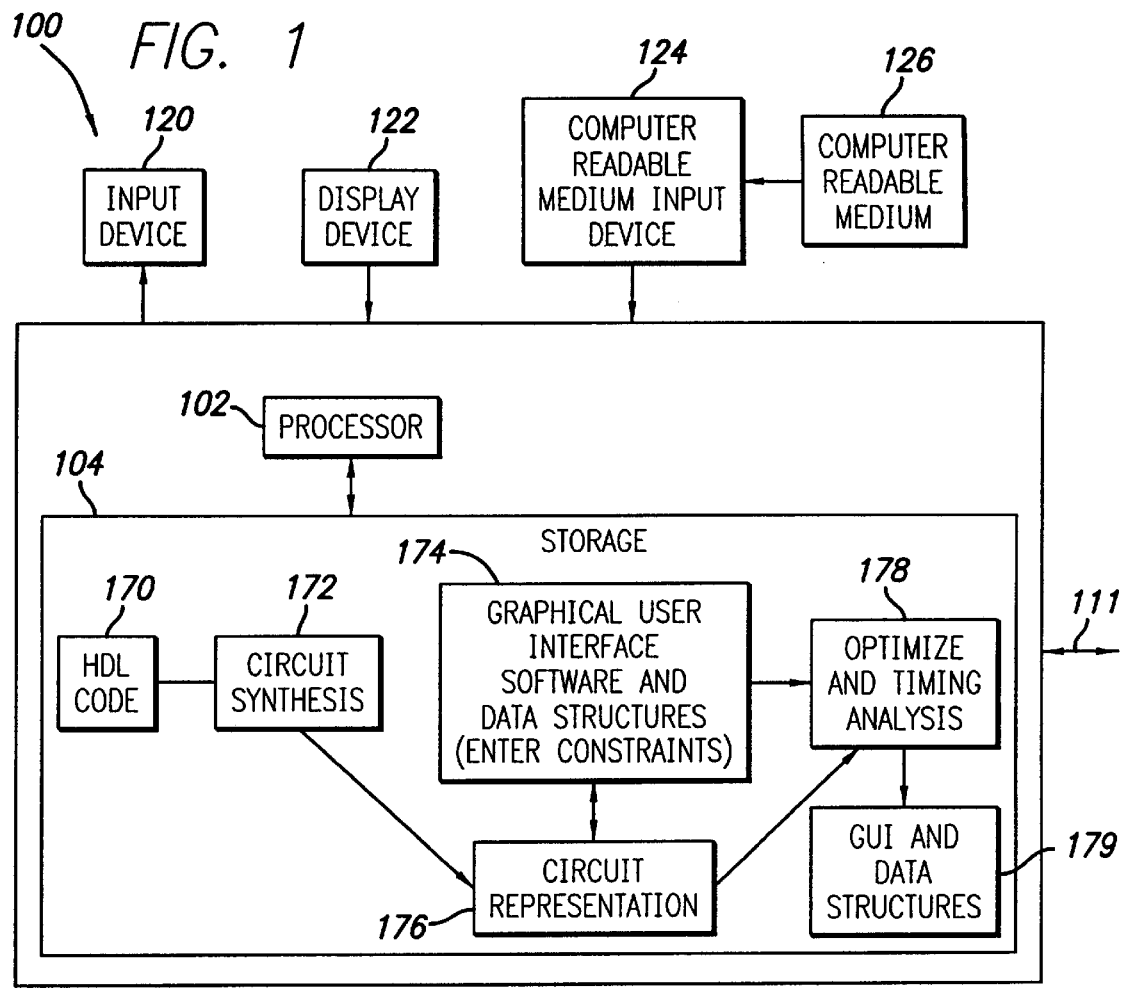
FIG. 1 is a block diagram of data processing system in accordance with a preferred embodiment of the present invention.

FIG. 1 is a diagram of a data processing system 100 in accordance with a preferred embodiment of the present invention. System 100 includes processor 102 and storage area (such as a memory) 104. Storage area 104 includes a circuit representation 176 and (usually) HDL code 170 from which circuit representation 176 was generated. Storage 104 also includes software for circuit synthesis 172, software for circuit optimization and timing analysis 178, and software 174 for generating and operating a graphical user interface (GUI) and data structures to support generation and operation of the GUI. Software 174 implements a GUI to allow the user to view and enter timing constraints for the path groups of the circuit representation 176 and to enter subpaths. GUI software and data structures 179 allow a user to view different display levels of the circuit after timing analysis. Although the software of FIG. 1 is shown in separate modules, other implementations can have fewer or more software modules.

System 100 includes an input device 120, such as a keyboard, a touchpad, or a mouse that receives input from a user or other appropriate source. Although the present invention is described in terms of a system in which the user enters inputs and responses using a computer mouse, any appropriate input device can be used. System 100 also includes a display device 122, such as a display screen, that outputs information to the user or other appropriate destination. In addition, system 100 includes a computer readable medium input device 124, which is capable of reading a computer readable medium 126.

A person of ordinary skill in the art will understand that the system of FIG. 1 may also contain additional elements, such as input/output lines; input devices, such as a keyboard, a mouse, and a voice input device; and additional display devices. The system of FIG. 1 may also may include application programs, operating systems, data, etc., which are not shown in the figure for the sake of clarity. It also will be understood that the system of FIG. 1 can also include numerous elements not shown, such as disk drives, keyboards, display devices, network connections, additional memory, additional CPUs, additional processors, LANs, input/output lines, etc.

In the following discussion, it will be understood that the steps of methods and flow charts discussed preferably are performed by processor 102 (or other appropriate processors) executing instructions stored in respective storage areas 104 (or other appropriate storage areas). Specifically, the steps described herein are performed by processor 102 executing graphical user interface software 174, 179. It will also be understood that the invention is not limited to any particular implementation or programming technique and that the invention may be implemented using any appropriate techniques for implementing the functionality described herein. The invention is not limited to any particular programming language, operating system, or network protocol.

Some or all of the instructions and data structures in storage areas 104 may be read into memory from computer-readable media 126. Execution of sequences of instructions contained in the storage areas causes processor 102 to perform the process steps described herein. In alternative embodiments, hard-wired circuitry may be used in place of or in combination with software instructions to implement the invention. Thus, preferred embodiments of the invention are not limited to any specific combination of hardware circuitry and software.

The term "computer-readable medium" as used herein refers to any medium that participates in providing instructions to a processor for execution. Such a medium may take many forms, including but not limited to, non-volatile media, volatile media, and transmission media. Non-volatile media includes, for example, optical or magnetic disks, such as a storage device. Volatile media includes dynamic memory. Transmission media include coaxial cables, copper wire and fiber optics, including the wires that comprise a bus within a computer. Transmission media can also take the form of acoustic or light waves, such as those generated during radio-wave and infra-red data communications, or electrical signals transmitted over a computer network.

Common forms of computer-readable media include, for example a floppy disk, a flexible disk, a hard disk, magnetic tape, or any other magnetic medium, a CD-ROM, any other optical medium, punchcards, papertapes, any other physical medium with patterns of holes, a RAM, a PROM, an EPROM, a FLASH-EPROM, any other memory chip or cartridge, a carrier wave as described hereafter, or any other medium from which a computer can read.

Various forms of computer readable media may be involved in carrying one or more sequences of one or more instructions to a processor for execution. For example, the instructions of timing software 110 may initially be carried on a magnetic disk or a tape. The instructions are loaded into storage area 104. Alternately, instructions can be sent over a telephone line using a modem. A modem local to the computer system can receive the data on the telephone line and use an infra-red transmitter to convert the data to an infra-red signal. An infra-red detector coupled to a bus can receive the data carried in the infra-red signal and place the data on the bus. The bus carries data to main memory, from which a processor retrieves and executes the instructions. The instructions received by main memory may optionally be stored on a storage device either before or after execution by a processor. A network connection of system 100 is generally designated 111 and can be any appropriate connection.

Figure 2:
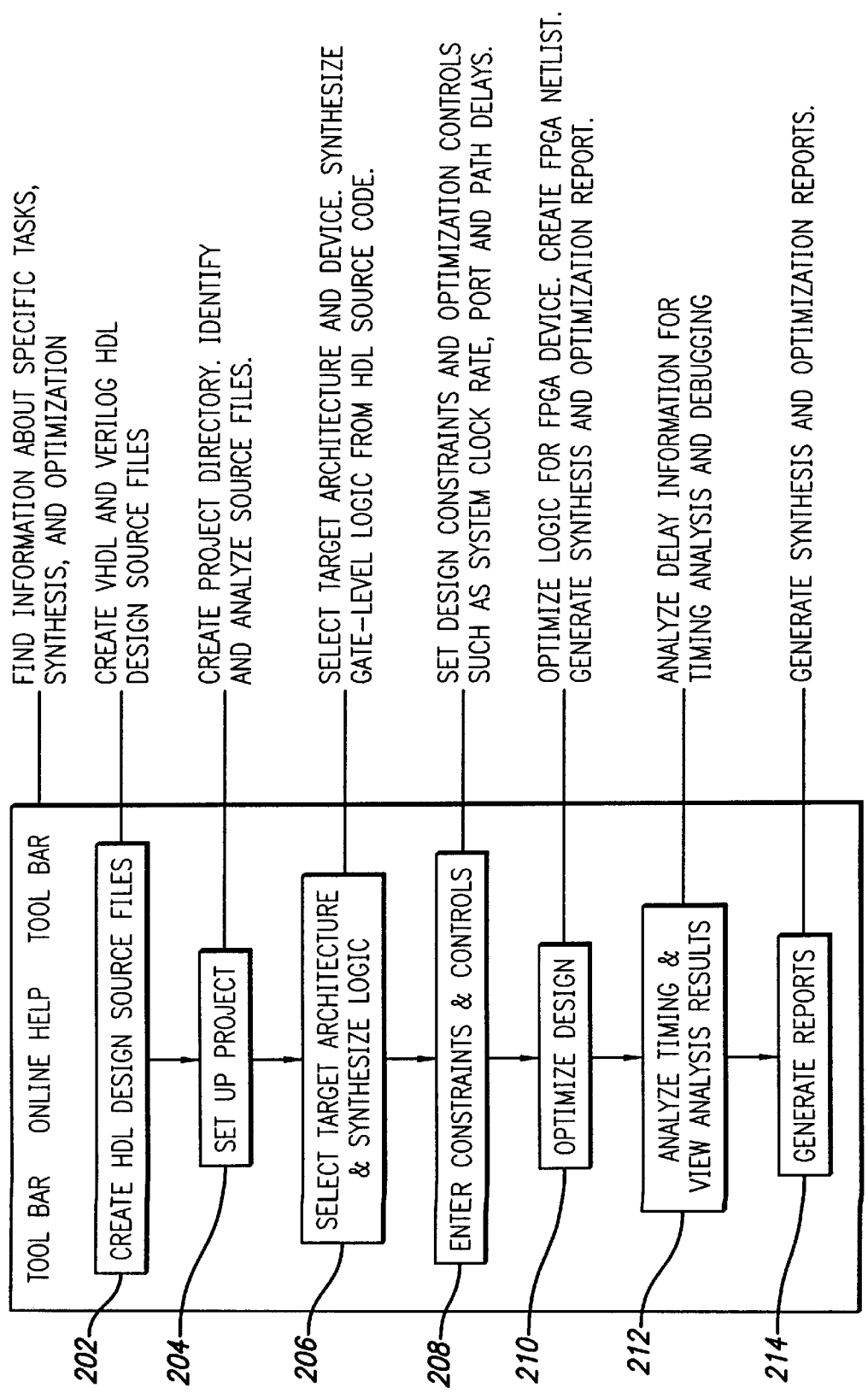
FIG. 2 is a flow chart showing an overview of the circuit design process.

FIG. 2 is a flow chart showing an overview of the circuit design process. Some of these steps are performed by a circuit synthesis software incorporating the present invention. The discussion of FIG. 2 is provided merely by way of example and not as a limitation. The present invention can be used with a wide variety of design methodologies, and is not limited to use with the methodology of FIG. 2. In step 202, a user or other entity creates HDL design source files. In step 204, the source files are identifies and analyzed. In step 206 the user selects a target architecture and executes a software tool that synthesizes a circuit representation from the HDL design source files.

In step 208, the user enters constraints and controls. For example, the user can specify a required delay value at either the port level or the path level. A required delay value is a maximum delay value that a signal can take to travel through a given path through the circuit. In step 210, the software tool optimizes the design, adhering to the constants and controls entered by the user. In step 212, a static timing analyzer analyzes the timing of the design, keeping track of delays for each timing group and allows the user to view the results of the analysis via the display levels, as described below. Step 214 generates reports.

II. The GUI

The present invention implements a GUI that allows the user to easily and conveniently enter design constraints for a circuit design, enter subpaths, and display levels of information. Prior to accepting constraints from the user or defining subpaths, a software tool incorporating the GUI needs to determine certain facts about the circuit being analyzed and/or synthesized. Determination of these facts are a prerequisite to generating a first display level of a GUI. After the first display level of the GUI is displayed, the user can then choose to view additional, more detailed information about the circuit by clicking on (or otherwise indicating) certain portions of GUI display. In the described embodiment of the present invention, the user can choose to view two additional levels of the GUI display after timing analysis has been performed in step 212 of FIG. 2. These second and third level views show details of delays for selected timing groups.

Figures 8A, 8D:
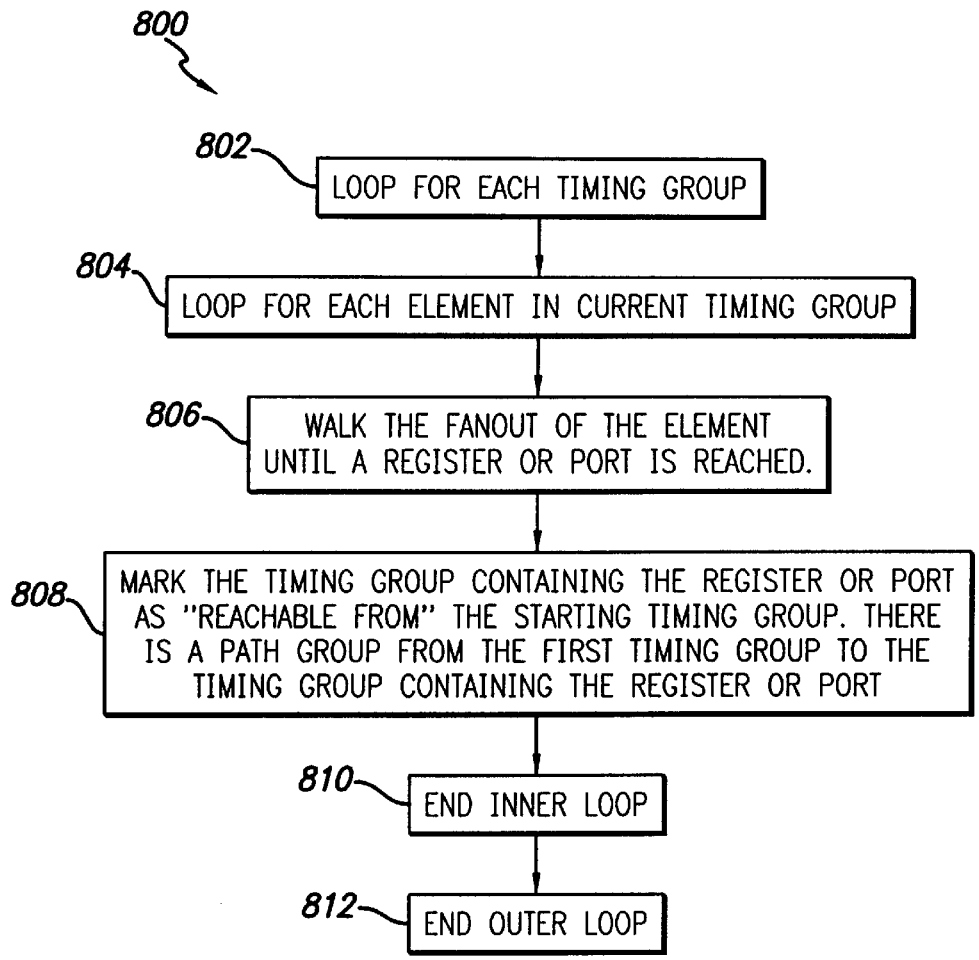
FIG. 8(a) is a flow chart showing steps performed to determine path groups for a circuit representation.
FIG. 8(d) is an example of a timing group table stored in a memory for the circuit of FIG. 8(b).

FIG. 3(*a*) shows a first display level 300 generated in accordance with the present invention. First display level 300 is generated after the circuit logic synthesizing step 206 of FIG. 2. An exemplary circuit for which first display level 300 might be generated is shown in FIG. 8(*b*). First display level 300 of the GUI includes a table having an entry (e.g., a row) 304 for each "path group" in the circuit.

A "path group" is the set of all combinational paths between two timing groups. A "timing group" is a set of sequential cells or ports in the circuit design that share the same timing behavior. For example, all flip-flops clocked by a common clock signal are grouped in one timing group.

FIG. 3(*a*) has four entries for four path groups. The path groups are:
 1) all input ports to all output ports
 2) all input ports to a timing group designated RC-N171
 3) the timing group designated RC-N171 to all output ports, and
 4) the timing group designated RC-N171 to the timing group designated RC-N171 (i.e., timing group RC-N171 is reachable from itself).

The "all input ports" and "all output ports" timing groups are default timing groups that exist for all circuits. They are displayed in first display level 300 with an "input" indicator 310 or an "output" indicator 312, respectively. In the example, the timing group RC-N171 is activated by a rising clock, as shown by rising clock indicator 314. Timing groups that are activated by a falling clock are so-indicated by a falling clock indicator (not shown) similar to rising clock indicator 314.

In step 408, software 174 generates and displays first display level 300 of a hierarchical table whenever a "path" tab is clicked or otherwise indicated by the user. As discussed above, software 174 automatically determines the timing groups and path groups of the circuit before displaying the first display level 300. First display level 300 is generated and displayed in accordance with the timing groups and path groups determined in steps 404 and 406.

As shown in FIG. 3(*a*), first display level 300 of the hierarchical table also includes a required delay value column 320 having one value for each path group. In the described embodiment, default required delay values 320 are set to a predetermined value (such as 60 nanoseconds).

The GUI of the described embodiment allows the user to change the required delay value constraint 320 for any or all of the path groups. In the described embodiment, the user can select a required delay value constraint from column 320 and enter a new value. When a required delay constraint is selected, it is displayed in a noticeable manner, such as highlighting, reverse, video, etc. The user selects the required delay constraint for a path group and types a new value in its place.

Once the user has entered a new required delay value constraint 320 for a path group, the new required delay value constraint will be added to the attributes of the path group in memory in place of the previous value. An example of required delay timing constraints for all path groups in the circuit of FIG. 3(*a*) are shown in FIG. 8(*d*). When the timing analyzer 178 is applied to the circuit representation, the required delay constraint attributes (see FIG. 8(*d*)) for the path groups of the circuit are input to the timing analyzer 178 and used as a timing constraint for the timing analysis of the corresponding path groups.

It will be understood that first display level 300 of FIG. 3(*a*) is exemplary only and that other displays of other first display levels will have different timing groups and path groups.

Figure 4:
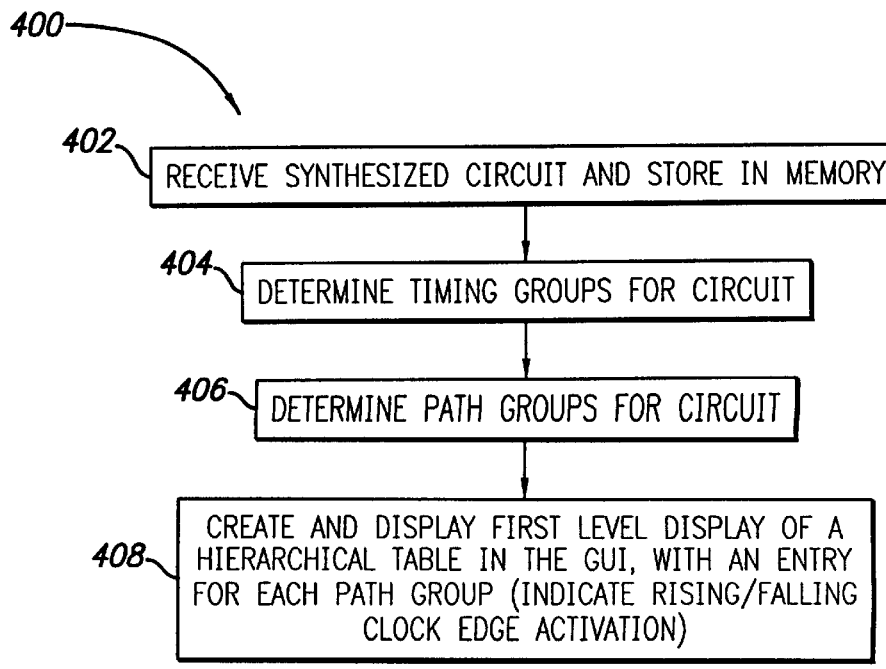
FIG. 4 is a flow chart showing steps performed by an embodiment of the present invention to generate the display screen of FIG. 3(a).
Figure 5:
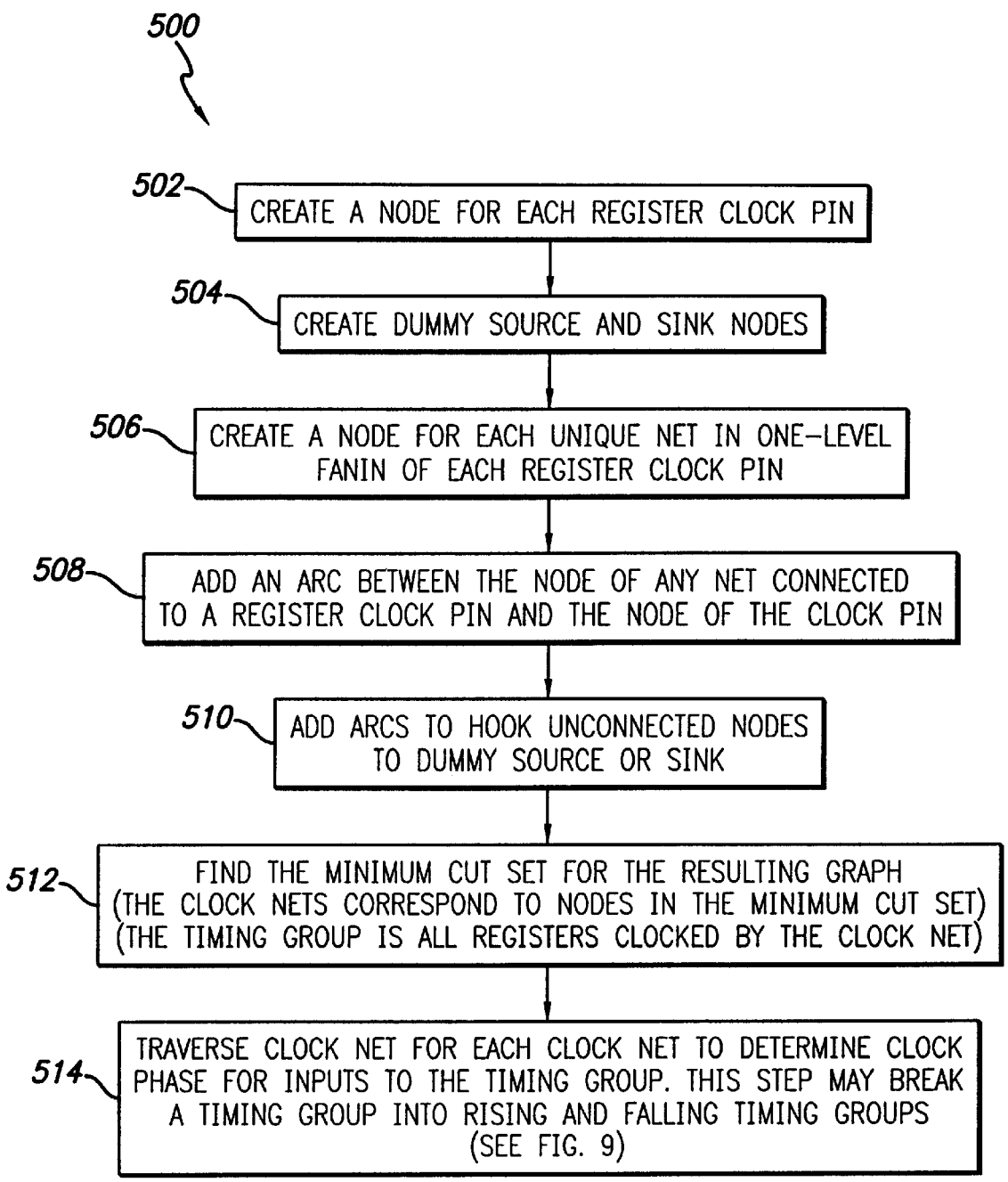
FIG. 5 is a flow chart showing how to determine a timing group for the circuit representation.
Figure 6A:
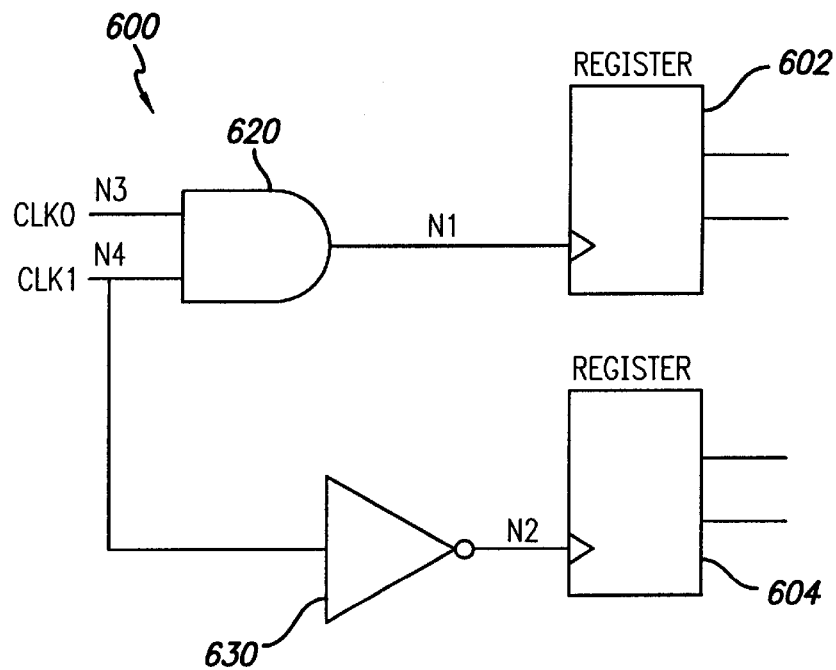
FIGS. 6(a) and 6(b) show exemplary circuit representations stored in a memory.
Figure 6B:
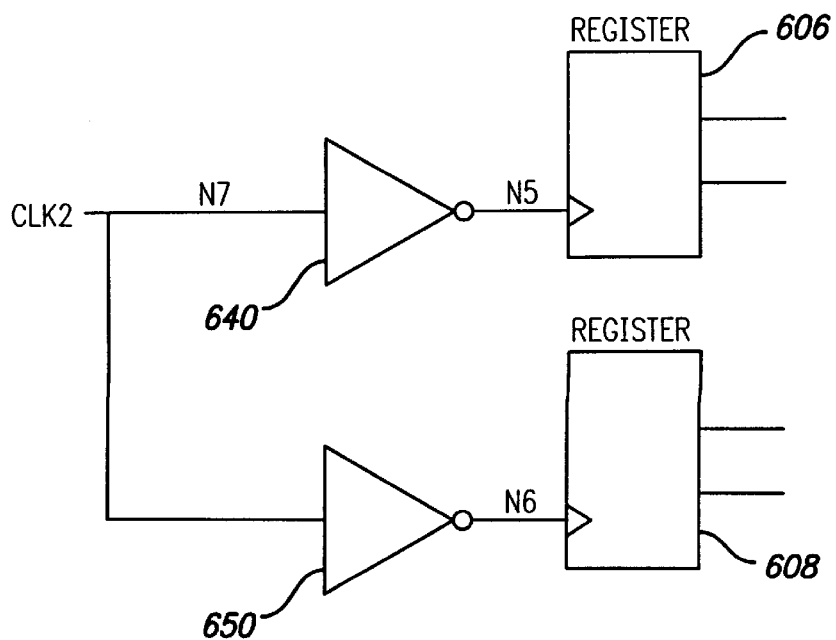

FIG. 4 is a flow chart showing an overview of steps performed by an embodiment of the present invention to generate the first display level 300 of FIG. 3(*a*). Prior to displaying first display level 300, software 174 first needs to determine the path groups. Prior to determining the path groups, software 174 needs to determine the timing groups. Details of determining timing groups are shown in FIGS. 5–7. Details of determining path groups are shown in FIGS. 8–9.

In step 402, the circuit representation is synthesized by, e.g., synthesis software 170. The remaining steps of FIG. 4 are performed by graphical user interface software 174.

In step 404, software 174 determines clock nets and timing groups for the circuit. A timing group is a set of sequential cells or ports in the circuit design that share the same timing behavior. For example, all flip-flops clocked by a common clock signal are grouped in one timing group. Further details of step 404 are discussed below in connection with FIGS. 5–7. In step 406, software 174 determines path groups for the circuit. A path group is the set of all combinational paths between two timing groups. Further details of step 406 are discussed below in connection with FIGS. 8–9.

In step 408, software 174 displays the first display level 300 of a hierarchical table in the GUI. First display level 300 includes an entry 304 for each path group. As discussed above, the exemplary circuit has three timing groups and four path groups 304.

As discussed above, software 174 must determine the timing groups and path groups before it can generate first display level 300 of FIG. 3(*a*). FIGS. 5–8 provide an example of a method of determining a timing group. FIG. 5 is a flow chart showing how to determine a timing group for the circuit representation. FIGS. 6(*a*) and 6(*b*) show an exemplary circuit representation stored in a memory. FIGS. 7(*a*) and 7(*b*) show a clock net for the circuit representation of FIG. 6.

The steps of FIG. 5 show steps to determine "clock nets". These steps are applied to two examples of a circuit in FIGS. 6(*a*) and 6(*b*). (Note that the example circuits of FIGS. 6–7 are not the circuit displayed in the GUI of FIG. 3(*a*)). The examples are provided only by way of explanation for timing paths. The circuit of FIG. 6(*a*) includes two registers 602, 604. Register 602 is clocked by clock signal CLK1 and CLK0. Register 604 is clocked by the inverse of clock signal CLK1. The one-level fanin for register 602 is AND gate 620. The one-level fanin for register 604 is inverter 630 having clock signal CLK1.

Registers 606 and 608 are clocked by the inverse of clock signal CLK2. The one-level fanin for registers 606 and 608 are the inverters 640, 650 having clock signal CLK2.

In step 502, software 174 creates, in memory 104, a node for each net connected to a register clock pin. Thus, nodes N1, N2, N5, and N6 of FIG. 7 are created for the nets of clock pins of registers 602, 604, 606, and 608, respectively. It should be noted that certain types of registers may have more than one clock pin.

In step 504, software 174 creates one dummy source and one dummy sink node for each circuit. Thus, in FIG. 7(*a*), Source node 1 and Sink node 1 are created. In FIG. 7(*b*), Source node 2 and Sink node 2 are created. In step 506, software 174 creates a node for each unique net in the one-level fanin of each register clock pin. Thus, the existence of AND gate 620 in FIG. 6(*a*) causes two unique one-level fanin paths to exist for registers 602, 604 in FIG. 7(*a*), while only one unique one-level fanin path exist for registers 606 and 608 in FIG. 7(*b*). Thus, nodes N3, N4, and N7 are created and connected to the nodes representing their respective clock pin nets. In step 508, software 174 adds an arc between the node of any net connected to a register clock pin and the node of the clock pin net. Thus, node N3 is connected to node N1; node N4 is connected to nodes N1 and N2; and node N7 is connected to nodes N5 and N6.

In steps 510, software 174 adds arcs to hook unconnected nodes to the dummy source or sink. Nodes with no fanins are connected to source. Nodes with no fanout are connected to sink. Thus, Source1 is connected to nodes N3 and n4 and Nodes N1 and N2 are connected to Sink1. Similarly, Source2 is connected to node N7 and Nodes N5 and N5 are connected to Sink2.

In step 512, software 174 finds the minimum cut set for the resulting graph. A minimum cut set is a minimum set of nodes that will split a graph into two pieces. Methods of determining cut sets are well-known to persons of ordinary skill in the art. Thus, the minimum cut set of the graph for CLK1 is the set N3, N4. The minimum cut set of the graph for CLK2 is the set N7. The clock nets for the graph of each of FIGS. 7(*a*) and 7(*b*) are all nets corresponding to nodes in minimum cut sets in the graph. The clock net for a graph are used to determine the timing groups for the circuit, since a timing group is defined as all registers clocked by a clock net.

In step 514, software 174 traverses each clock net to determine the phase of the clock input to the timing group. This step may break a timing group into rising edge and falling edge timing groups. Additional details of step 514 are shown in FIG. 9. In step 514, in the example, the timing groups for FIG. 6(*a*) are: RC, CLK0, CLK1. In step 514, in the example, the timing groups for FIG. 6(*b*) are: FC, and CLK2.

Once the timing groups of a circuit have been determined, software 174 determines the path groups of the circuit. A "path group" is the set of all combinational paths between two timing groups. FIG. 8(*a*) is a flow chart showing steps performed to determine path groups for the circuit representation. As shown in the figure, an outer loop exists between step 802 and step 812. An inner loop exists between steps 804 and 810. Thus, for each timing group, and for each element in the current timing group, in step 806, software 174 walks the fanout of the element until a register or port is reached. In step 808, each timing group containing the register or port is marked as "reachable" from the starting timing group. There is a path group from the first timing group to the timing group containing the register or the port.

Because "all input ports" and "all output ports" are timing groups, "all input ports to all output ports" is a path group. For the circuit of FIG. 8(*b*), for the register R1, walking the fanout of the port P1 to register R1 determines a path group of "all inputs to RC-N171." Walking the fanout of register R1 to the port P2 determines a path group of "RC-N171 to all outputs." Walking the fanout of register R1 to register R2 determines a path group of "RC-N171 to RC-N171." It will be understood that various conventional improvements can be used in the marking step to increase the efficiency of the graph traversal. For example, the step may mark elements already visited to avoid having to re-traverse portions of the graph.

FIG. 9 is a flow chart 900 showing steps to determine whether a timing group is activated by a rising or falling clock edge. The method traverses all paths in each clock net. In the described embodiment, the default for a path group activation is "rising edge." As each inverter is encountered in the traversal, the clock phase is toggled from rising edge to falling edge or vice versa. As each register is encountered, it is placed in either a "rising edge" or "falling edge" timing group, depending on the current clock phase. Thus, the steps of FIG. 9 may break each timing group into two timing groups if the elements of the timing group are activated by both rising and falling edge clock signals.

The circuit representation of FIG. 8(*b*) has been discussed above. In this example, the circuit has three timing groups: all input ports, all output ports, and RC-N171. In contrast, the circuit representation of FIG. 8(*c*) has an additional inverter 630. This inverter means that register R2 is activated by a falling clock edge. Thus, after executing of the steps of FIG. 9, the circuit representation of FIG. 8(c) has four timing groups: all input ports, all output ports, RC-N172, and FC-N172. (Note that timing group names are generated automatically, and any appropriate naming scheme can be used. The timing group names herein are provided for purpose of example only).

III. Allowing the User to Specify and Change Timing Constraints via the GUI

Specifically, each path group has its own required timing delay value. Before the timing analyzer runs, software 174 allows the user to change the required delay value for a path group.

Figure 3A:
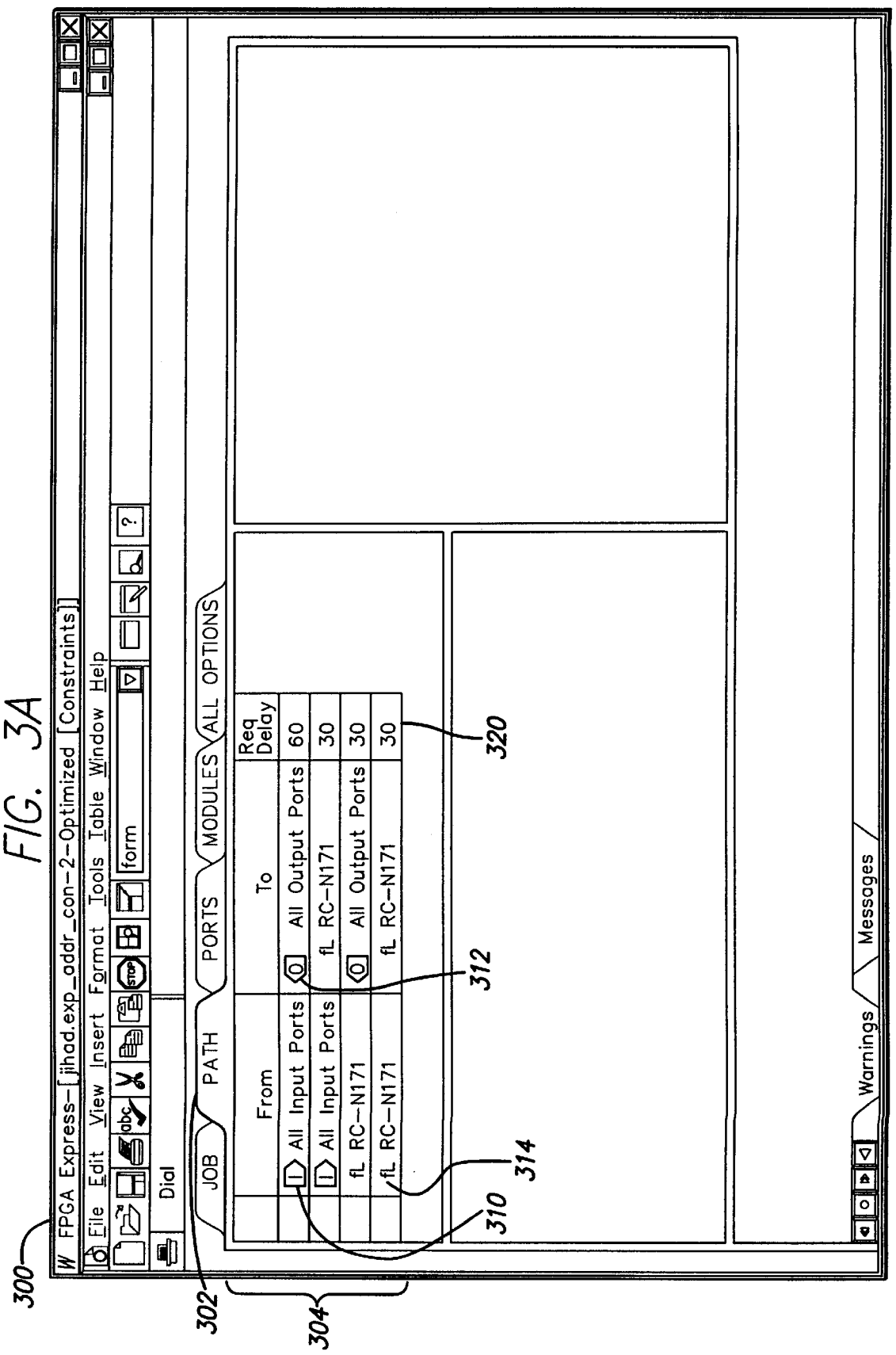
FIG. 3(a) shows a first display screen generated in accordance with the present invention, where the screen display includes a first GUI display level prior to performance of timing analysis.
Figure 3B:
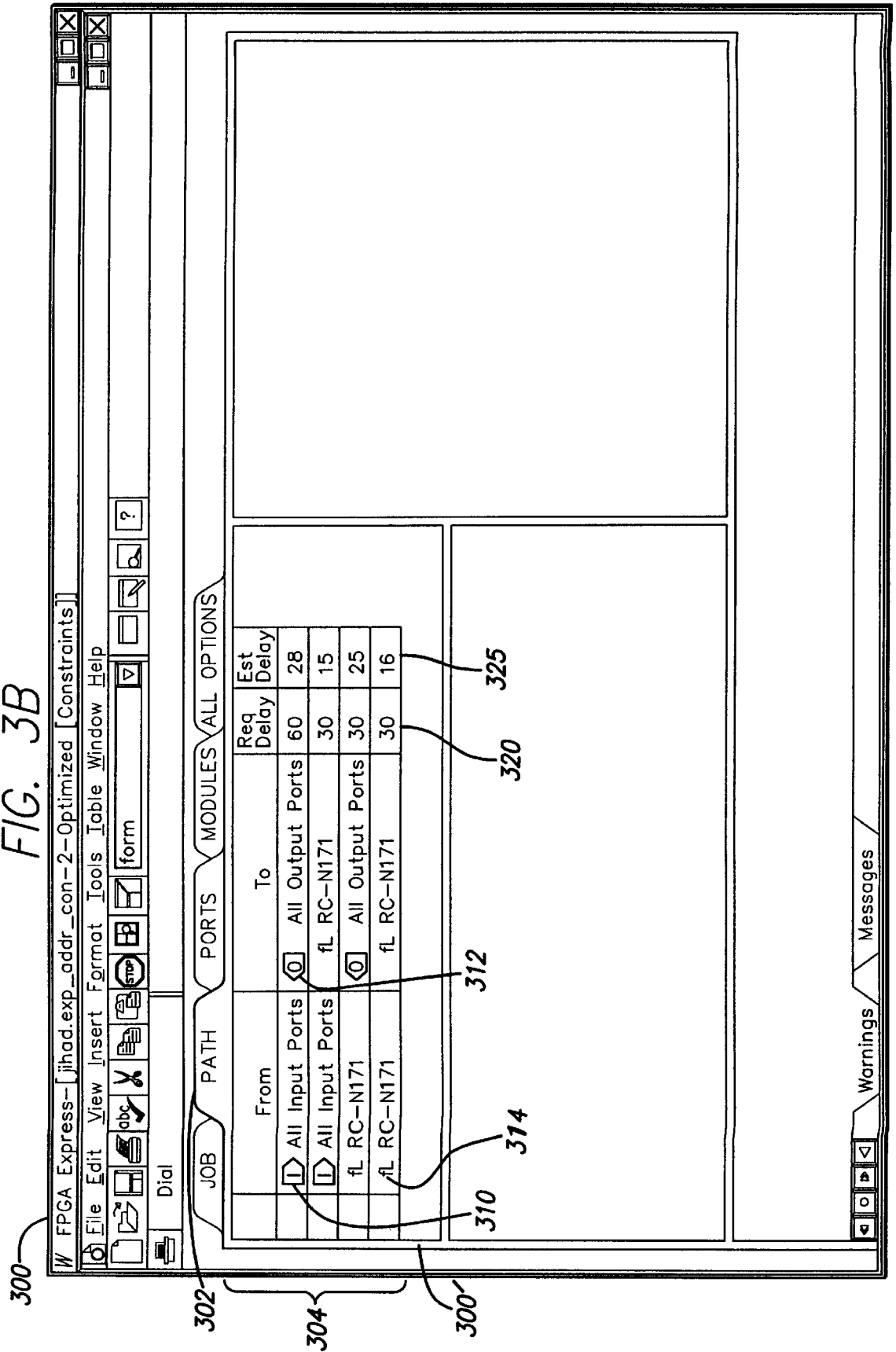
FIG. 3(b) shows a first display screen generated in accordance with the present invention, where the screen display includes a first GUI display level after performance of timing analysis.
Figure 3C:
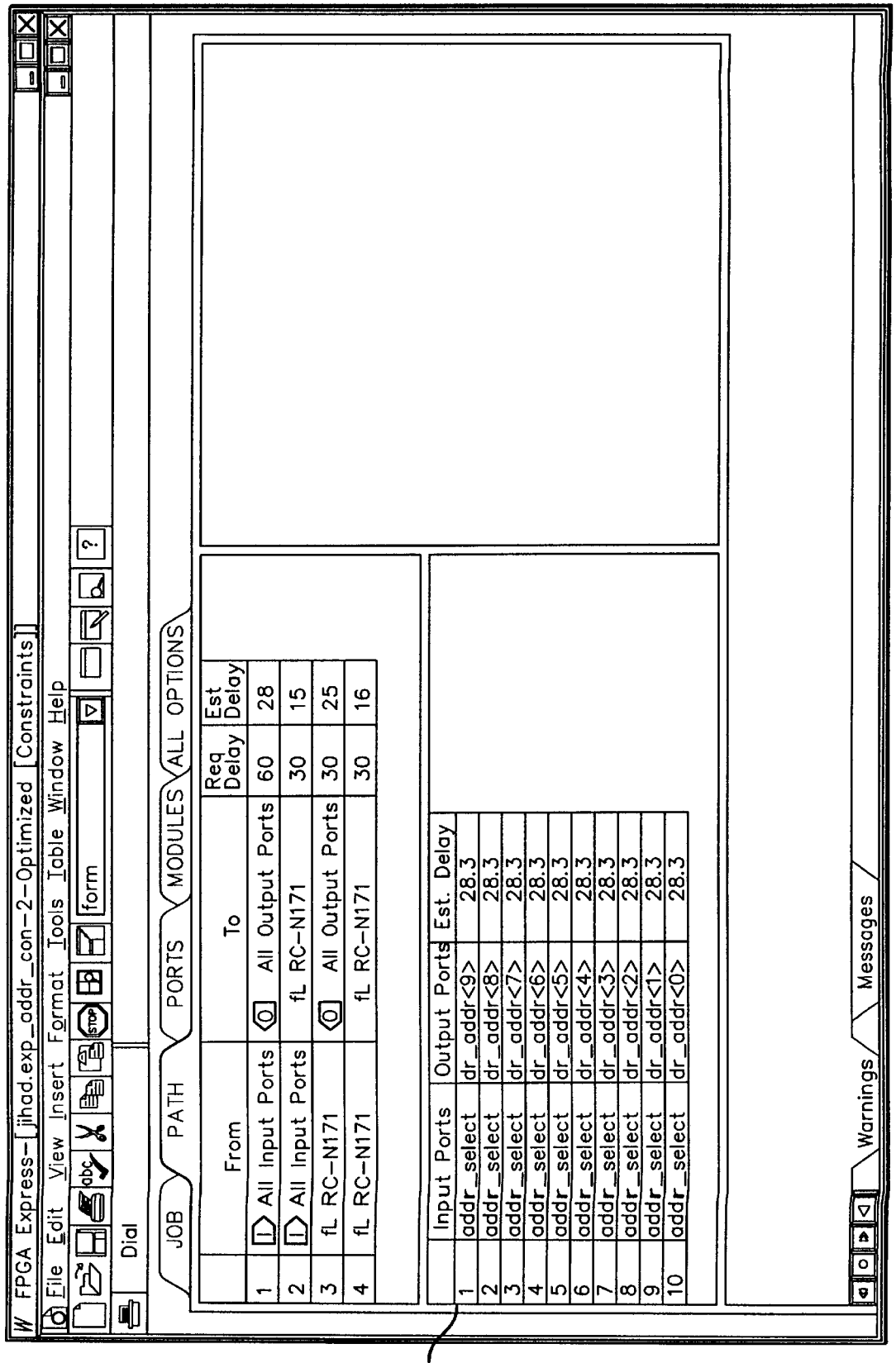
FIG. 3(c) shows a second display screen generated in accordance with the present invention, where the screen display includes a second display level after performance of timing analysis.
Figure 3D:
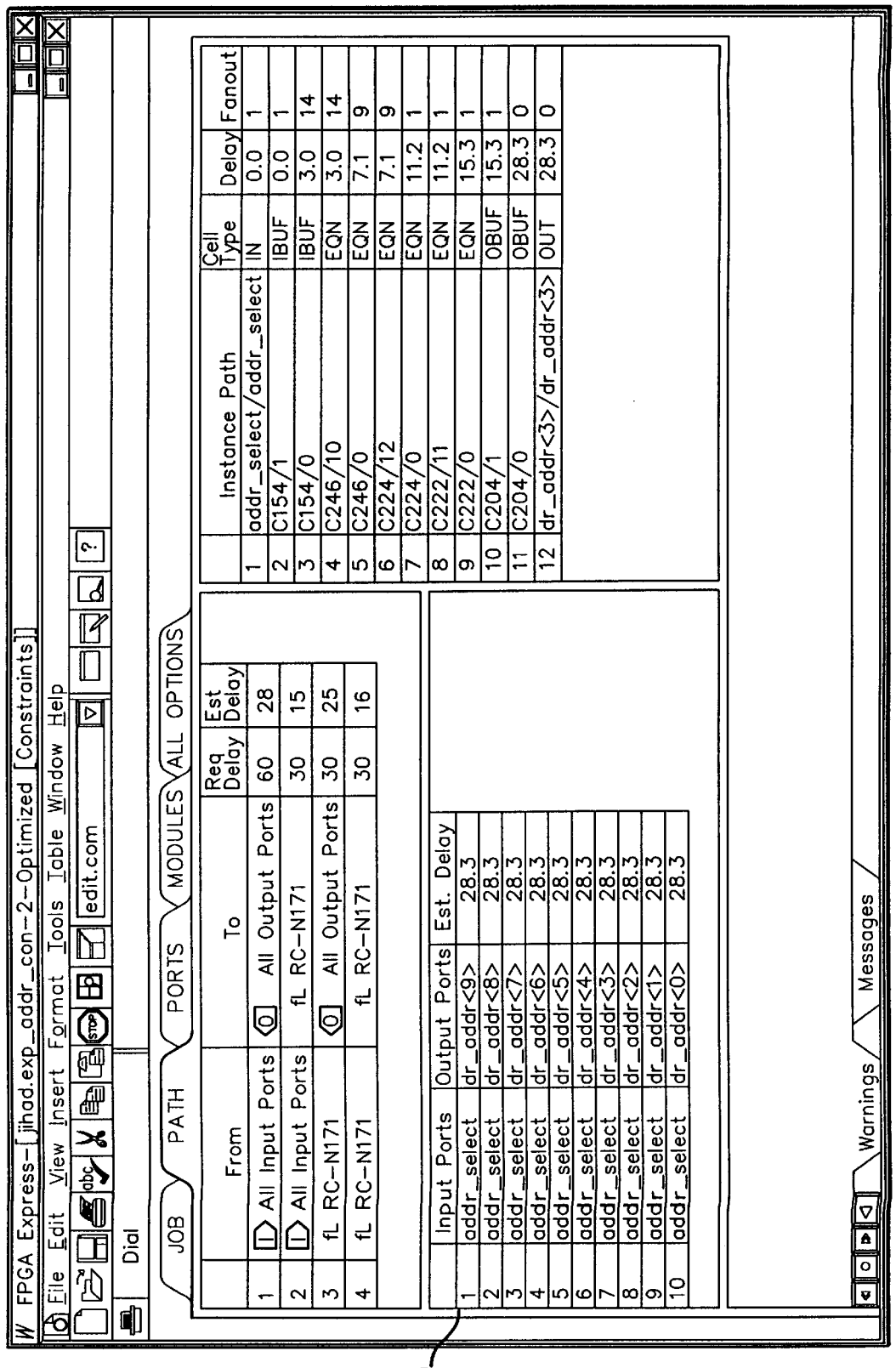
FIG. 3(d) shows a third display screen generated in accordance with the present invention, where the screen display includes a third display level after performance of timing analysis.
Figure 10A:
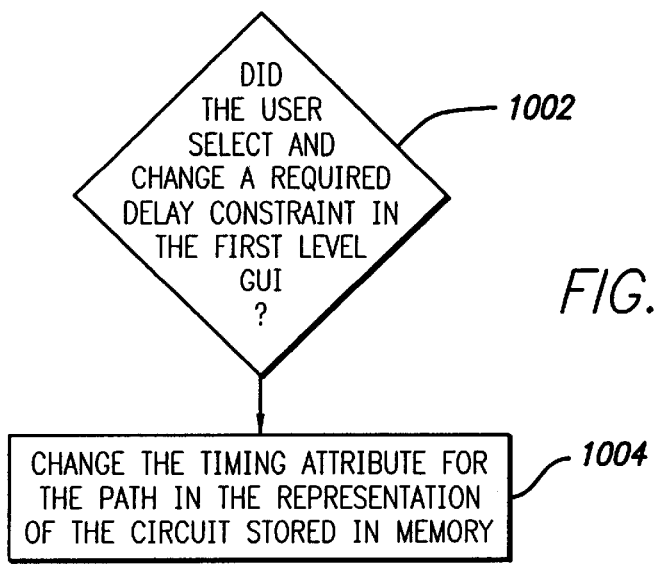
FIG. 10(a) is a flow chart showing steps performed in response to user input to change timing constraints, after the display of FIG. 3(a) is displayed.

FIG. 10(a) is a flow chart showing steps performed in response to user input, after the display of FIG. 3(a) is displayed. As shown in step 1002 of FIG. 10(a), when software 174 detects that the user has selected and changed a required delay constraint in the first display level 300, software 174 changes the required delay constraint in the path group for the path group in the circuit representation stored in memory. An example of such required delay constraints stored in memory are the required delay constraints of FIG. 8(f). Thus, for example, if the user selects the third path group in first display level 300 of FIG. 3(a) (i.e., if the user selects path group "RC-N171 to all output ports"), and then enters a new required delay value of "60, the old required delay 320 is replaced in memory by the new required delay value. Thus, in FIG. 8(f), the value in entry 872 would be changed from "30" to "60."

IV. Allowing the User to Create Subpaths

Certain embodiments of the present invention allow the user to create additional path groups called "subpaths." A subpath is a path group that is a subset of an existing path group. The user might want to create a subpath, for example, if he wants to be able to specify the constraints for a smaller part of an automatically generated path group. In the described embodiment, subpaths can only be added in step 208 by software 174. Subpaths cannot be added after the circuit is optimized.

Figure 11:
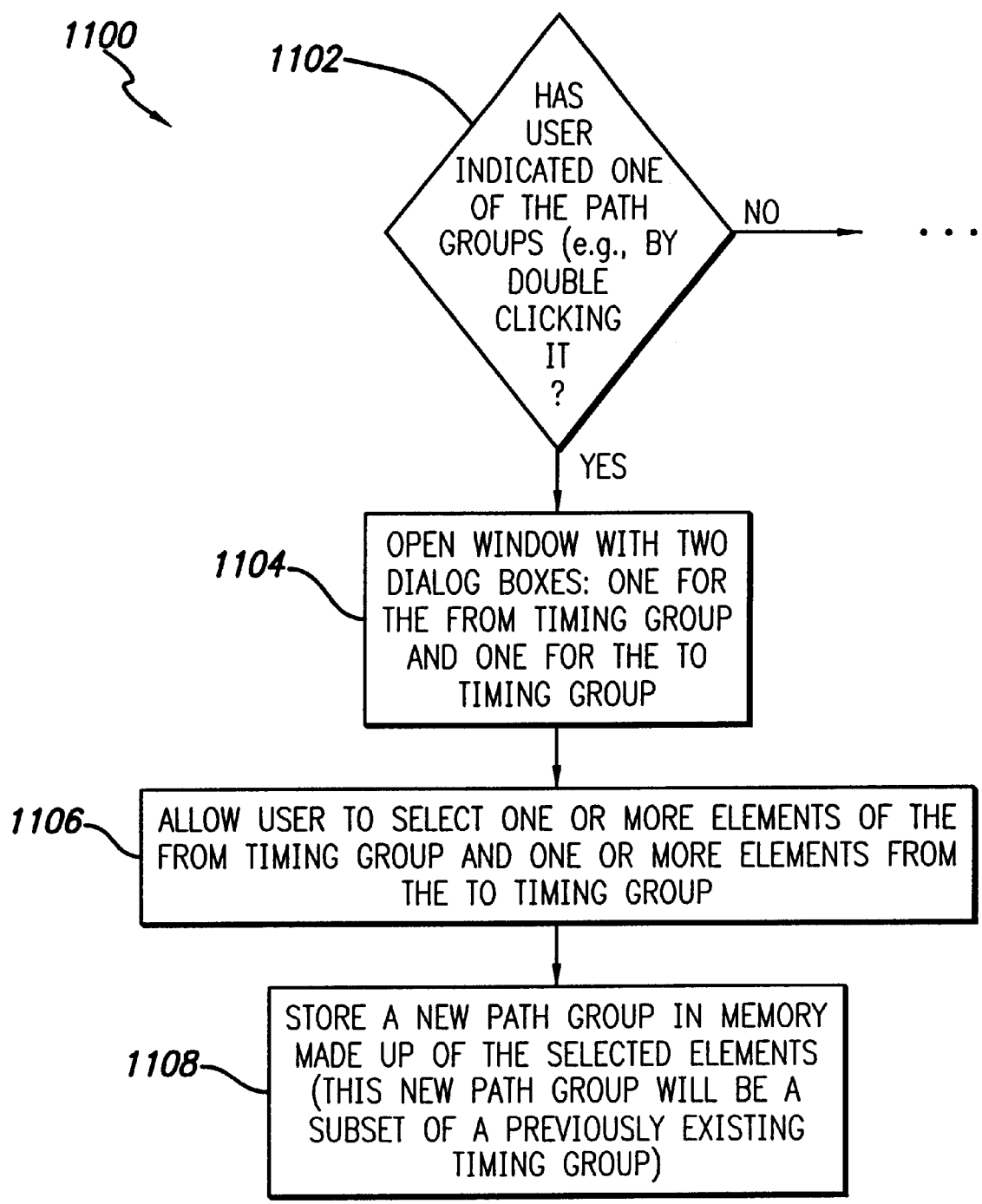
FIG. 11 is a flow chart showing steps performed to add a subpath.
Figure 12A:
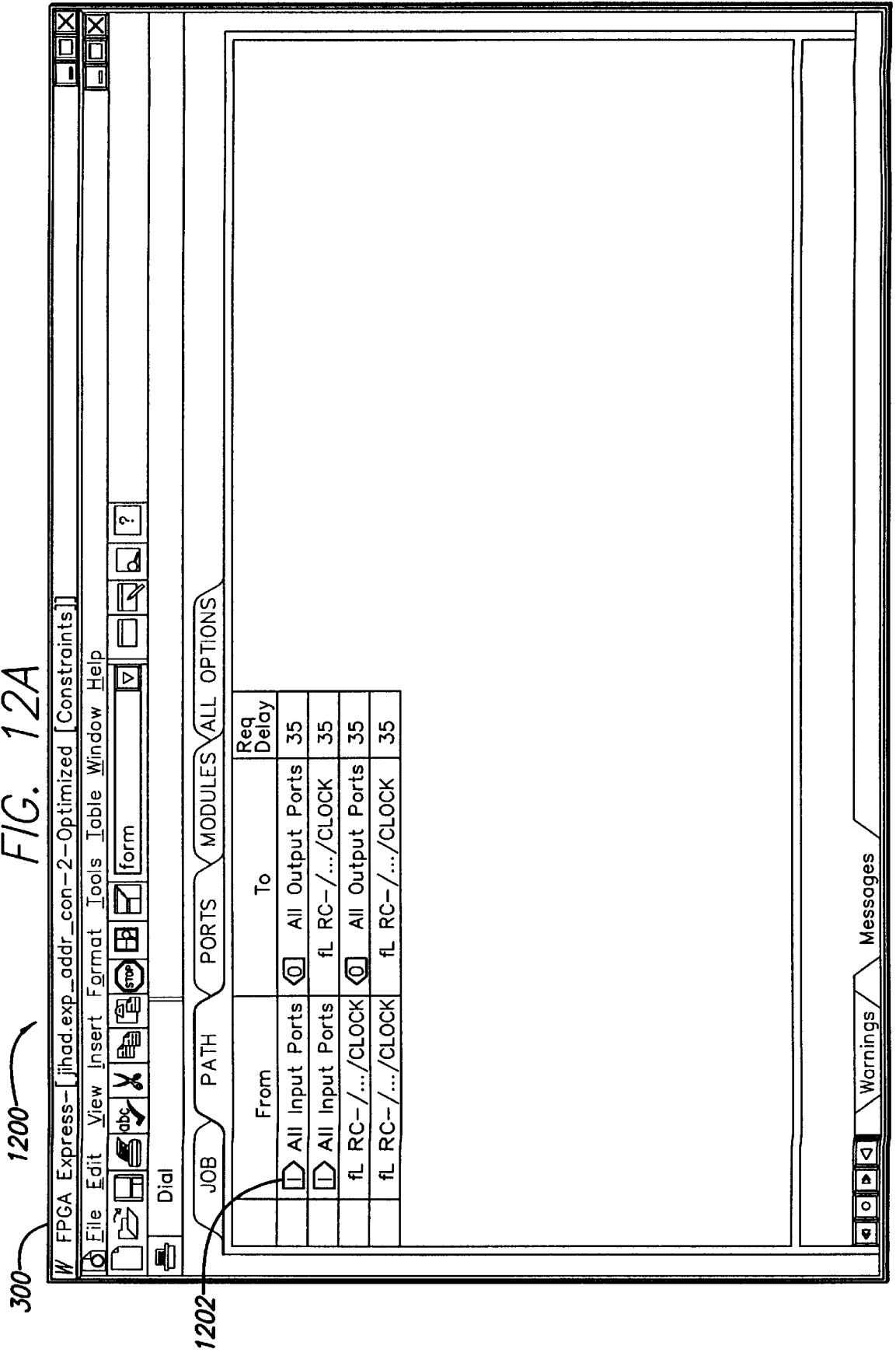
Figure 12C:
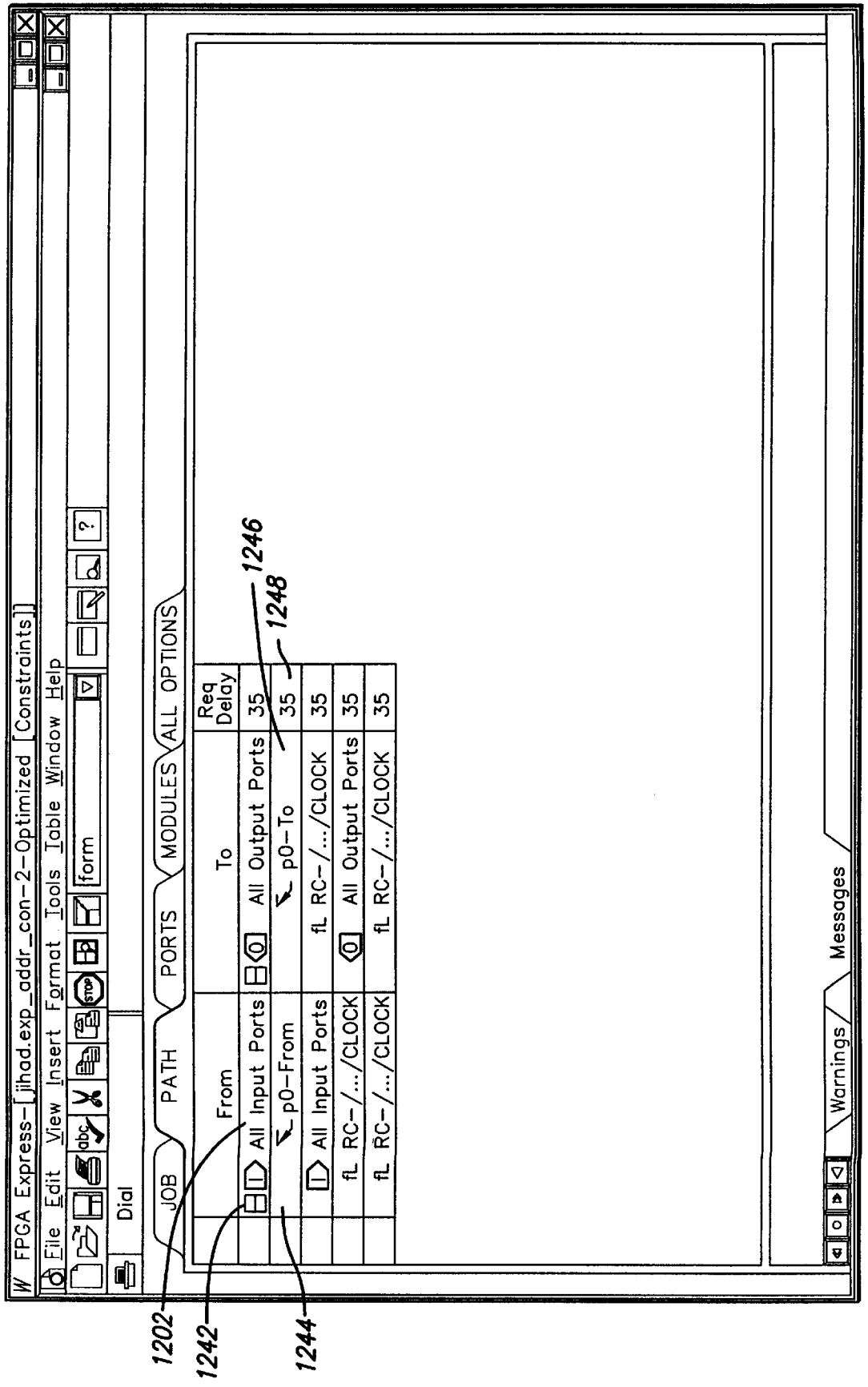

FIG. 11 is a flow chart showing steps performed by software 174 to add a subpath. FIGS. 12(a)–12(c) show an example of display screens used to add subpaths in accordance with the present invention. The steps of FIG. 11 are described below in a connection with the example of FIGS. 12(a)–12(c).

FIG. 12(a) shows an example 1200 of first display level 300 for a circuit. (Note that this example uses a different circuit than the example of FIGS. 3(a)–3(d)). In the example, first display level 300 includes four path groups:

1) all input ports to all output ports (designated by reference numeral 1202), 2) all input ports to a timing group designated RC-/ . . . /CLOCK, 3) the timing group designated RC-/ . . . /CLOCK to all output ports, and 4) the timing group designated RC-/ . . . /CLOCK to the timing group designated RC-/ . . . /CLOCK (i.e., timing group RC-/ . . . /CLOCK is reachable from itself.

When a user double clicks on one of the path groups in display 300 (such as, for example, path group "all input ports to all output ports" 1202), it indicates that the user wishes to create a subpath, and the display of FIG. 12(b) is displayed. It will be understood that the user can use any appropriate mechanism for indicating a path group and the mechanism of double clicking is provided for the purpose of example.

FIG. 12(b) shows a dialog box 1220 having a window 1228 and a window 1229. Window 1228 contains the elements in the timing group "all input ports" (because that is the FROM portion of the path group 1202 indicated by the user in FIG. 12(a)). Window 1229 contains the elements in the timing group "all output ports" (because that is the TO portion of the path group 1202 indicated by the user in FIG. 12(a)).

Dialog box 1220 also includes a primary path box 1222, which lists the name of the indicated path group (here, "all input ports to all output ports"). Dialog box further includes a subpath name area 1224, in which the user can enter a name to be assigned to the subpath being created. In the example, the user has indicated that the subpath being created is to be named "p0". In at least one embodiment, if no name is entered, a default name is used. Dialog box 1220 further includes a Delay box 1226, in which the user can enter a required delay constraint for the subpath being created. In at least one embodiment, if no required delay value is entered, a default required delay value is used. Dialog box 1220 further includes select all and clear all buttons for each of windows 1228 and 1229; an OK button 1239; two select names boxes 1237 (one for each of windows 1228 and 1229), in which the user can enter the name of elements; and two select buttons (one for each select names box), which accept the name typed in select names box 1237. The operation of select all, clear all, and OK buttons are well-known to users of windows-type user interfaces and will not be described in detail herein.

In the example, the user has selected elements D<1> 1230 and D<3> 1232 in the first window 1228 and elements Y_OUTPUT<1> 1233 and Y_OUTPUT<3> 1234 in the second window 1229. The elements D<1> and D<3> are subsets of the FROM timing group of the user-selected path group 1202 and will form the FROM timing group of the new subpath "p0". The elements Y_OUTPUT<1> and Y_OUTPUT<3> are subsets of the TO timing group of the user-selected path group 1202 and will form the TO timing group of the new subpath "p0". After the user clicks the OK button, software 174 stores the newly created subpath in the circuit representation in memory (such as the path group table of FIG. 11(d)). Software 174 also stores the newly created timing groups (i.e., the selected FROM and TO elements) of the circuit representation in memory (such as the timing group table of FIG. 11(e)). The delay value for the new subpath is also stored in memory, (such as in the delay value table of FIG. 8(f).

Note that, in the described embodiment, a subpath will always be a subset of an existing path group. When the user has indicated the elements in the timing groups of the new subpath, he clicks the OK button (or indicates completion is some appropriate way) and the first level display 300 is again displayed FIG. 12(c) shows first level display 300 after the p0 subpath has been added. The "parent" path group "all input ports to all output ports" 1202 has a small minus sign 1242 displayed next to its name to indicate that the path group has at last one subpath. If the user clicks on the minus sign 1242, the subpaths will be collapsed, as is known to persons of ordinary skill in the art, and will not be displayed on display 300. Collapsed path groups have a small "plus" sign displayed next to their name (not shown).

FIG. 12(c) shows that the newly added subpath p0 is now listed as one of the path groups of the circuit. This display includes the new FROM timing group 1244 (p0_From) and the new TO timing group 1246 (p0_TO). The user-entered delay value (or a default value) is displayed as required delay value 1248. It will be understood that the newly created subpath can be treated the same as any other path group in the first level display. The user can also change the timing constraints of the subpath and display second and third level information for the subpath.

V. Allowing the User to View Additional Display Levels

Figure 10B:
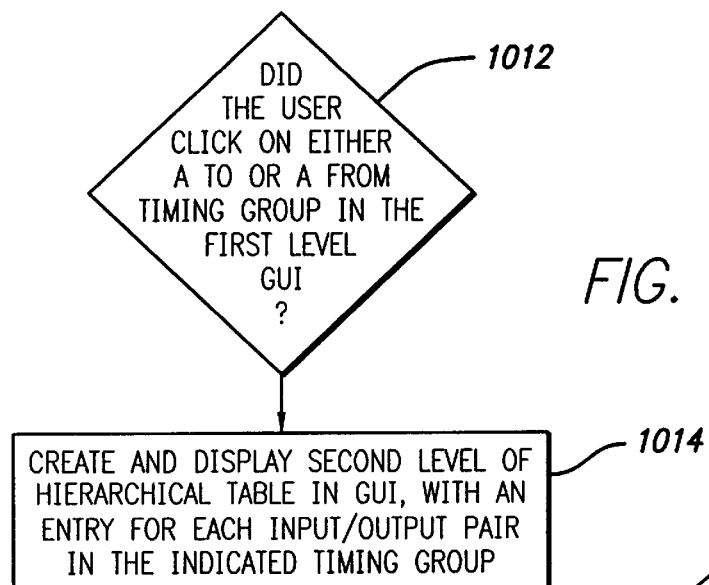
FIGS. 10(b) and 10(c) are flow charts showing steps performed in response to user input to view lower display levels, after the display of FIG. 3(b) is displayed.
Figure 10C:
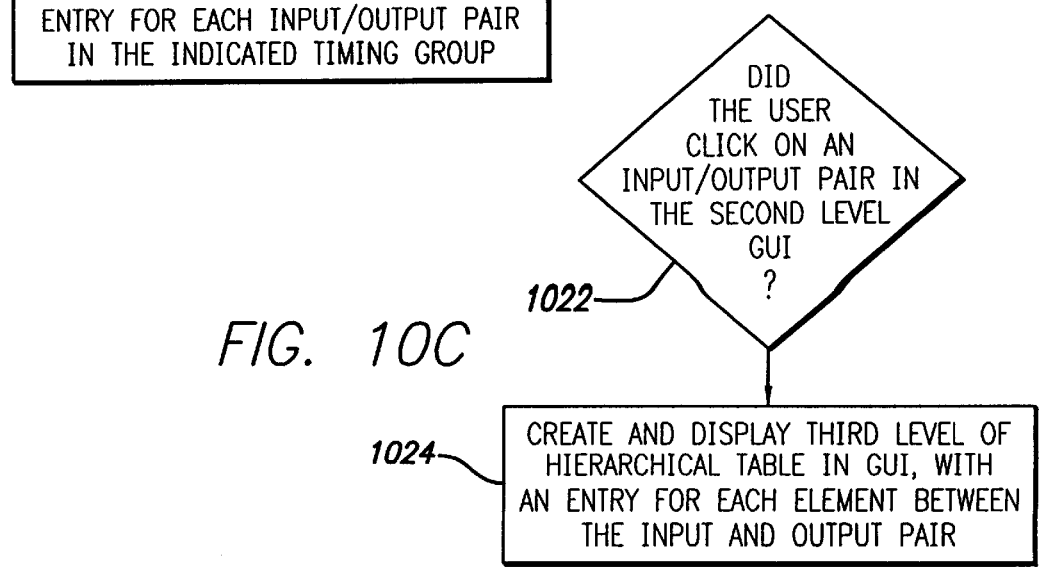

FIGS. 10(b) and 10(c) are flow charts showing steps performed in response to a user's choosing to view additional GUI display levels after the display 300' of FIG. 3(*b*) is displayed. As discussed above, display 300' is displayed after timing analysis.

Display 300' of FIG. 3(*b*) includes a column 325 for estimated delay values for each path group. FIG. 3(*c*) shows a second display screen generated in accordance with the present invention, where the display screen includes a second display level 330 of the GUI. As shown in FIG. 10(*b*), when the user clicks on a timing group (or otherwise indicates a timing group) in the first display level 300' of FIG. 3(*b*), software 179 displays second display level 330 of the hierarchical table, an example of which is shown in FIG. 3(*c*). The second display level 330 includes an entry for each input/output endpoint pair in the indicated timing path. If, for example, the user clicks on the path group "all inputs to all outputs" in FIG. 3(*b*) the individual bit-level start and end ports in the path group are displayed, along with estimated delays for each path in FIG. 3(*c*).

FIG. 3(*d*) shows a third display level screen generated in accordance with the present invention, where the screen display includes a third display level 360 of the GUI. As shown in FIG. 10(*d*), when the user clicks on a bit-level path (or otherwise indicates a bit-level path) in the second display level 360, software 179 displays third display level 360 of the hierarchical table, an example of which is shown in FIG. 3(*d*). Third display level 360 includes an entry for each element in the path that was selected in the second level. If, for example, the user clicks on the path "addr_select to dr_addr<3>" in second display level 330, the elements in this path are displayed in third display level 360, along with cell type 362, calculated cumulative delay, 364 and fanout 366 for each element. The second and third level displays use delay values generated by the timing analyzer for the circuit, examples of which are shown in FIGS. 8(*g*), 8(*h*), and 8(*I*).

In summary, the present invention provides a user with a graphical user interface (GUI) that automatically determines timing groups and path groups for a circuit representation. In first display level 300, the GUI displays each path group in the circuit and allows the user to change the timing constraints for each path group. In addition, the GUI indicates whether each timing group is activated by a rising or falling clock signal and allows the user to create subpaths of the path groups. The user can use the GUI to specify subpaths. These subpaths, which are treated as other path groups, are always a subset of an existing path group.

After timing analysis, by clicking (or otherwise selecting) a timing group in first GUI display level 300', the user can view a second GUI display level, which indicates details of the paths in the indicated timing group. By clicking (or otherwise selecting) a path in the second GUI display level, the user can view a third GUI display level, which shows a list of each of the elements in the indicated path.

While the invention has been described in conjunction with a specific embodiment, it is evident that many alternatives, modifications and variations will be apparent to those skilled in the art in light of the foregoing description. For example, the user can enter different or additional types of constraints or controls via the GUI, such as the minimum delay or the maximum slew rate. Accordingly, it is intended to embrace all such alternatives, modifications and variations as fall within the spirit and scope of the appended claims and equivalents.

What is claimed is:

1. A method of allowing a user to specify timing constraints, comprising the steps, performed by a data processing system, of:

determining timing groups for a circuit representation;

determining path groups for a circuit representation in accordance with the determined timing groups;

displaying a first GUI display level in accordance with the determined path groups, wherein a timing constraint value is shown for each path group;

detecting that a user has selected and changed one of the timing constraint values in the first GUI display level; and changing a corresponding timing constraint value stored in memory.

2. The method of claim 1, wherein the two determining steps are performed automatically, without receiving a command from the user.

3. The method of claim 1, wherein the two determining steps are performed upon initialization of a software tool.

4. The method of claim 1, wherein the two determining steps are performed when the user clicks on a path tab.

5. The method of claim 1, wherein the displaying step is performed after the two determining steps and when the user indicates that timing information for the timing groups should be displayed.

6. The method of claim 1, further comprising the step of:

indicating in the first GUI display level whether each path group in each timing group is activated by a rising or a falling clock signal.

7. The method of claim 1, further comprising the steps of:

receiving an indication that the user has clicked on a timing group that is displayed in the first GUI display level; and displaying a second GUI display level, wherein timing information is shown for each path in the indicated timing group.

8. The method of claim 7, further comprising the steps of:

receiving an indication that the user has clicked on a displayed path in the second GUI display level; and displaying a third GUI display level, wherein the elements of the path are shown.

9. The method of claim 8, further comprising displaying timing information for each element in the path.

10. The method of claim 1, further comprising the step of:

displaying hierarchical display levels lower than the first level, and including additional information about the timing groups.

11. The method of claim 10, wherein the lower level hierarchical display levels are displayed in response to user input.

12. The method of claim 1, further including the step of allowing the user to create a subpath that is a subset of an existing path group and that is treated like an existing path group.

13. The method of claim 12, wherein the allowing step includes the steps of:

displaying a window containing all the TO elements of an existing timing group;

displaying a window containing all the FROM elements of an existing timing group;

allowing the user to indicate at least one of the TO elements to form a TO timing group for the subpath;

allowing the user to indicate at least one of the FROM elements to form a FROM timing group for the subpath.

\* \* \* \* \*